United States Patent [19]
Mitani et al.

[11] Patent Number: 5,559,731
[45] Date of Patent: Sep. 24, 1996

[54] IC CARD

[75] Inventors: Hidenori Mitani; Shin-ichi Ishimoto, both of Itami, Japan

[73] Assignee: Mitsubishi Denki Kabushiki Kaisha, Tokyo, Japan

[21] Appl. No.: 507,165

[22] Filed: Jul. 26, 1995

[30] Foreign Application Priority Data

Dec. 15, 1994 [JP] Japan .................. 6-312130

[51] Int. Cl.$^6$ .............................. G11C 5/06; G11C 17/00
[52] U.S. Cl. .................. 365/52; 365/63; 365/94
[58] Field of Search .................. 365/52, 63, 94

[56] References Cited

U.S. PATENT DOCUMENTS 5,402,385  3/1995  Ozeki et al. .................. 365/52

FOREIGN PATENT DOCUMENTS 4137077  5/1992  Japan .
4147495  5/1992  Japan .
4222997  8/1992  Japan .
 512510  1/1993  Japan .
5120501  5/1993  Japan .

*Primary Examiner*—David C. Nelms
*Assistant Examiner*—Trong Phan
*Attorney, Agent, or Firm*—Leydig, Voit & Mayer

[57] ABSTRACT

An IC card in which the content of a ROM may be modified without replacing the ROM by dismantling the card. The IC card comprises: a ROM for storing a program; an input-output section for inputting/outputting signals from/to an external equipment; a controller for processing the input/output signal from/to the external equipment in accordance with the program in the ROM; and a control gate for, in normal operation, connecting the input-output section to the controller and for connecting the input-output section to the ROM when the external equipment is to rewrite the content of the ROM.

8 Claims, 6 Drawing Sheets

| $\overline{S}$ | A | YA | YB |
|---|---|---|---|
| H | L | Z | L |
| H | H | Z | H |
| L | L | L | Z |
| L | H | H | Z |

Z : HIGH IMPEDANCE

| INPUT | | OUTPUT | |
|---|---|---|---|
| $\overline{S}$ | G | YD | YE |
| H | H | Z | D→YE |
| H | L | Z | YE→D |
| L | H | D→YD | Z |
| L | L | YD→D | Z |

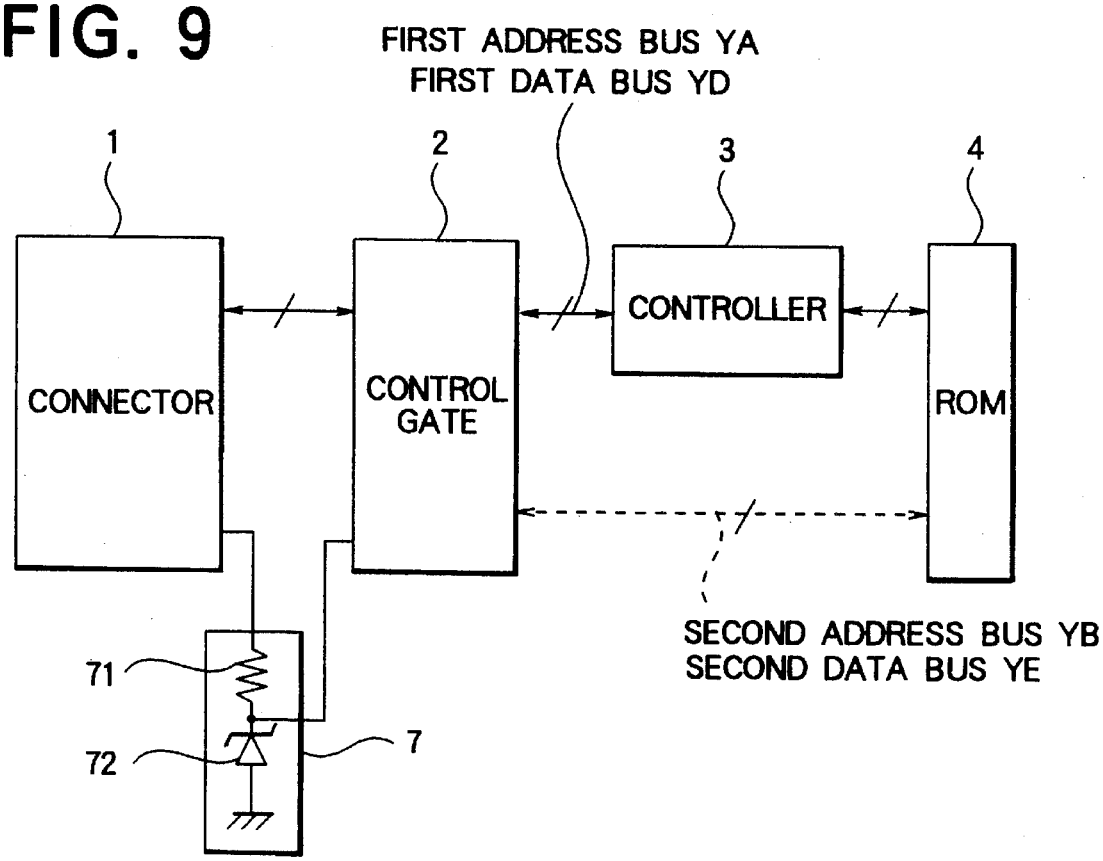

IC CARD

BACKGROUND OF THE INVENTION

1. Field of the Invention

The present invention relates to an IC card having a memory such as a ROM,

2. Description of the Related Art

Some IC cards are provided as having a communication function such as of LAN so that they may be used to perform communication, for example, between personal computers. An IC card of this type comprises a controller serving as a processing section for performing the communication processing and a ROM which stores a program for controlling the controller.

In a conventional IC card of this type, it is sometimes required to modify the content of a ROM (firmware) for controlling the controller. In such a case, if the controller itself is not provided with a function of rewriting the content of the ROM, the IC card must be dismantled to replace the ROM. Accordingly, the dismantling of the IC card must be performed every time when a new version of the firmware is intended.

SUMMARY OF THE INVENTION

To solve the problems as described, it is an object of the present invention to provide an IC card in which the content of a memory such as a ROM may be easily modified without dismantling the IC card to replace the memory even when the content of the memory must be modified in the case where its controller is not provided with a function of rewriting the content of the memory.

An IC card according to the present invention comprises: a memory for storing a program; an input-output section for inputting/outputting a signal from/to external equipment; a processing unit for processing an input/output signal from/to the external equipment in accordance with the program in the memory; and a connection controlling section for, in normal operation, connecting the input-output section to the processing section and for connecting the input-output section to the processing section and the memory when the external equipment is to rewrite the content of the memory.

Further, a register may be provided for storing an input signal from the external equipment, whereby the connection controlling section switches connections when a predetermined signal is stored in the register.

Furthermore, a detector may be provided for detecting the level of an input signal from the external equipment, whereby the connection controlling section switches a connection when a level detected by the detector has exceeded a predetermined level.

BRIEF DESCRIPTION OF THE DRAWINGS

FIG. 9 is a block diagram of an IC card according to a third embodiment of the invention.

DESCRIPTION OF THE PREFERRED EMBODIMENTS

First Embodiment

Figure 1:
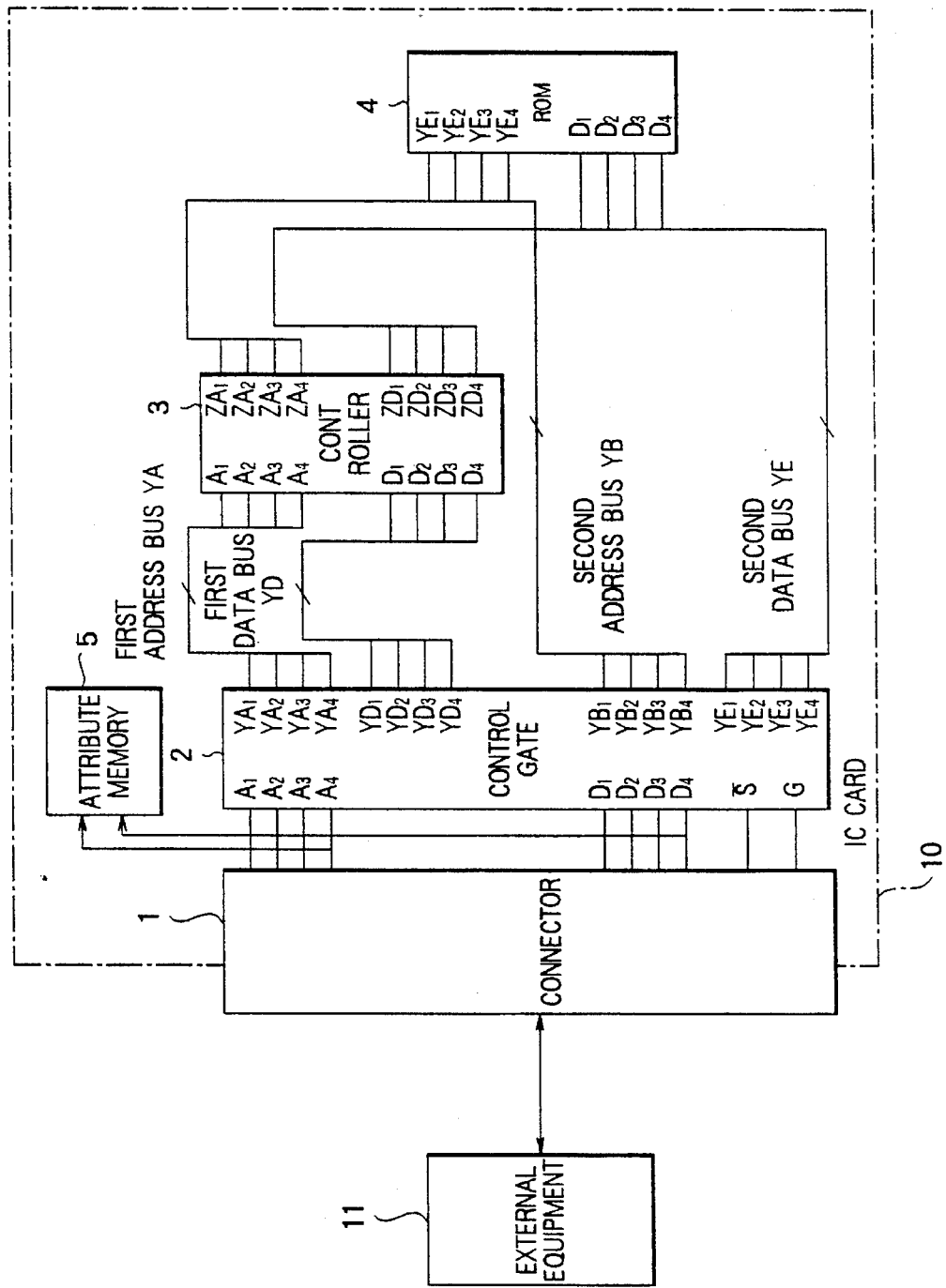
FIG. 1 is a block diagram of an IC card according to a first embodiment of the invention.

A first embodiment of the present invention will be described below with reference to the drawing.

FIG. 1 is a block diagram of an IC card according to the first embodiment of the invention. As shown in the figure, an IC card 10 includes: a connector 1 serving as an input-output section for inputting/outputting necessary signals (address signal, data signal, control signal, etc.) from/to external equipment; a control gate 2 connected to the connector 1 for connecting the necessary signals to the buses (first address bus YA and first data bus YD) to be used in normal operation or to the buses (second address bus YB and second data bus YE) which are used in rewriting a ROM used as a memory; a controller 3 serving as a processing section connected to the first address bus YA and first data bus YD for communication control; the ROM 4 storing a program which is necessary for the operation of the controller 3; and an attribute memory 5 for storing attribute information of the IC card. The ROM 4 is connected to the second address bus YB and second data bus YE and at the same time is connected to address bus ($ZA_1$~$ZA_4$) and data bus ($ZD_1$~$ZD_4$) of the controller 3. Further, the external equipment 11 may be a personal computer.

It should be noted that, while both the address signal and data signal in FIG. 1 are shown as 4-bit signals for the convenience of explanation,, the first embodiment may be applied to cases using different numbers of bits.

Figures 2, 3:
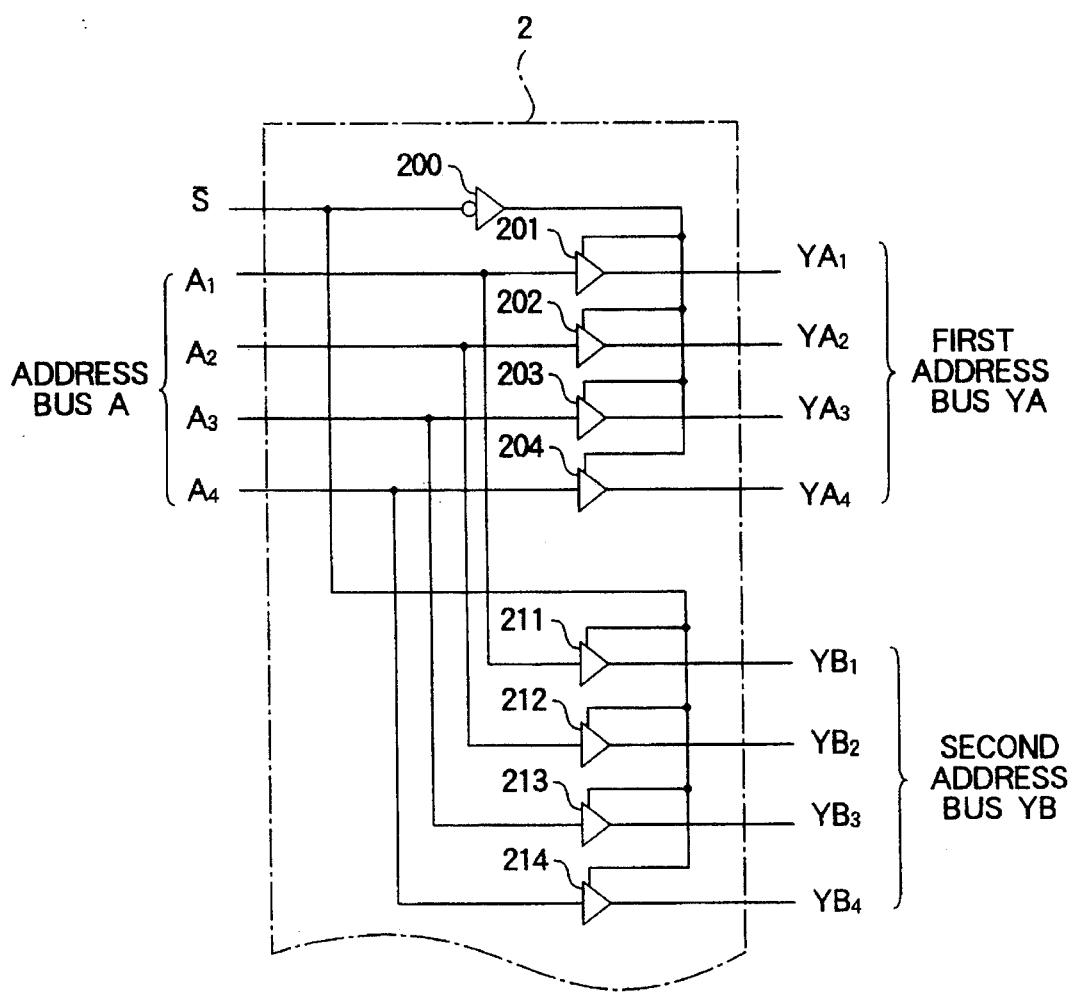
FIG. 2 shows an address bus switching section of the control gate of the first embodiment of the invention.
FIG. 3 is a truth table of the address bus of FIG. 2.

FIG. 2 is a detailed diagram of the internal structure of the control gate 2, showing its construction for switching the address bus. In this figure, a first inverter 200 receives and inverts a control signal (selection signal) $\overline{S}$ from the connector 1. A first address signal outputting buffer group 201~204 ior outputting a first address signal outputs address signal $A_1$~$A_4$ to the first address bus YA ($YA_1$~$YA_4$) based on the output signal of the inverter 200. A second address signal outputting buffer group 211~294 for outputting a second address signal outputs address signal $A_1$~$A_4$ to the second address bus YB ($YB_1$~$YB_4$) based on the control signal $\overline{S}$ from the-connector 1. When these buffers are not active, their outputs are in a high impedance (Z) state. FIG. 3 is a truth table of the circuit shown in FIG. 2.

Figures 4, 5:
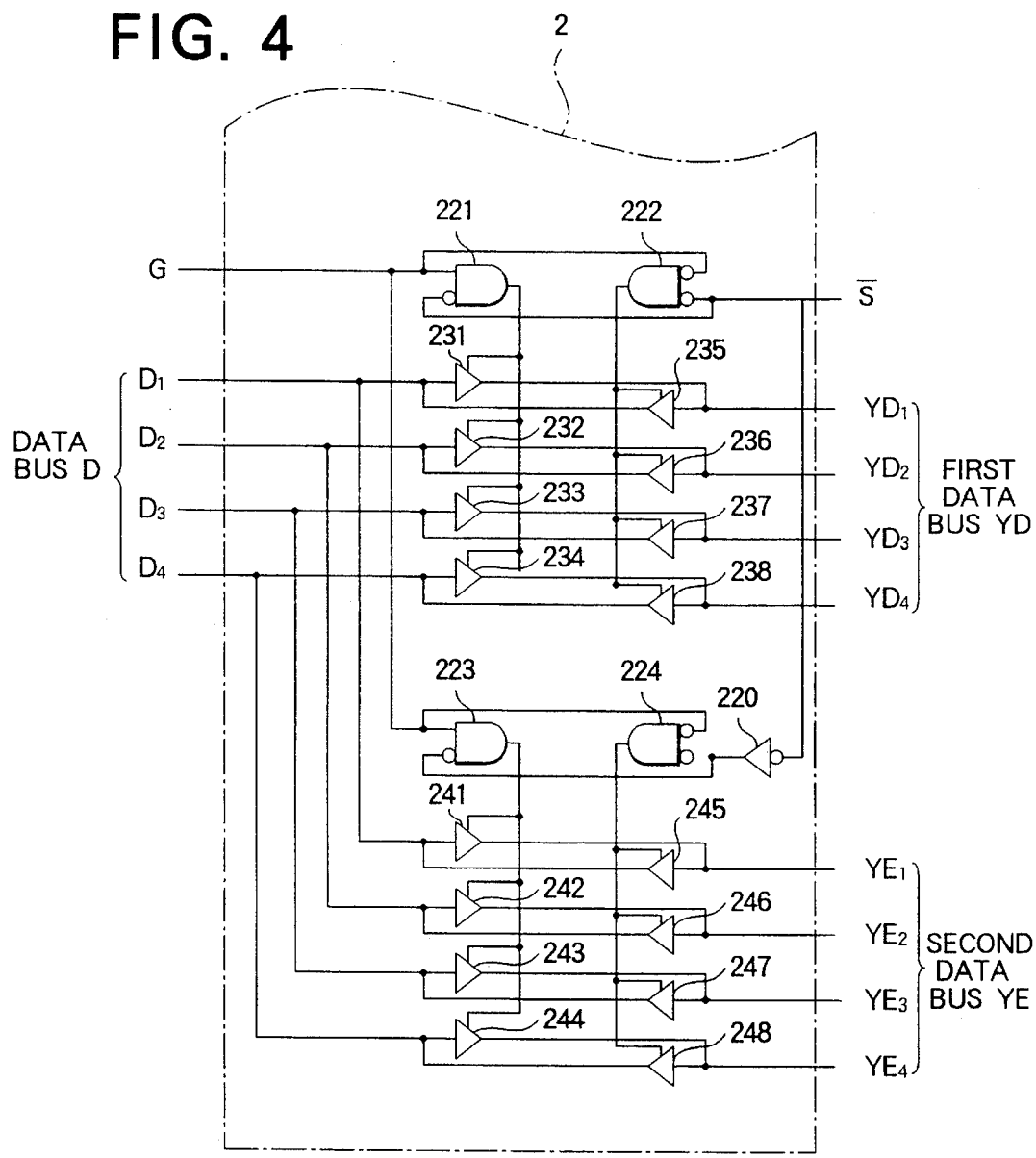
FIG. 4 shows a data bus switching section of the control gate according to the first embodiment of the invention.
FIG. 5 is a truth table of the data bus switching section of FIG. 4.

FIG. 4 also shows in detail the internal structure of the control gate 2, showing the construction for switching the data bus. In this figure, a first inverter 220 receives and inverts the control signal $\overline{S}$ from the connector 1. A first gate circuit formed by gates 221, 222 receives the control signal $\overline{S}$ and a control signal (gate signal) G and controls the connection between data bus $D_1$~$D_4$ and the first data bus YD ($YD_1$~$YD_4$). A second gate circuit formed by gates 223, 224 receives an output signal of the inverter 220 and the control signal (gate signal) G and controls the connection between the data bus $D_1$~$D_4$ and the second data bus YE ($YE_1$~$YE_4$). A first data signal outputting buffer group 231~234 provides data signal $D_1$~$D_4$ to the first data bus YD ($YD_1$~$YD_4$) based on the output signal of the gate 221. A second data signal outputting buffer group 235~238 provides the signal $YD_1$~$YD_4$ of the first data bus YD to the data bus ($D_1$~$D_4$) based on the output signal of the gate 222. A third data signal outputting buffer group 241~244 provides data signal $D_1$~$D_4$ to the second data bus YE (YE$_1$~YE$_4$) based on the output signal of the gate 223. A fourth data signal outputting buffer group 245~248 provides the signal YE1~YE4 of the second data bus YE to the data bus ($D_1$~$D_4$) based on the output signal of the gate 224. FIG. 5 is a truth table of the circuit shown in FIG. 4.

The operation of the first embodiment will be described below by way of FIGS. 6 and 7.

When the IC card 10 is connected to the external equipment 11, the external equipment 11 first reads necessary data from the attribute memory 5 of the IC card 10 to perform initialization, etc.

In normal operation, the control signal G is at its "L" level. Thereby, as shown in FIGS. 3 and 5, the address bus A and the data bus D are connected to the first address bus YA and the first data bus YD, respectively. At this time, the second address bus YB and second data bus YE are in their high impedance (Z) state. As a result, the ROM 4 is connected to the address bus (ZA$_1$~ZA$_4$ and data bus (ZD$_1$~ZD$_4$) of the controller 3. It should be noted that direction of inputting/outputting of data in the data bus is controlled by the control signal G. A truth table at this time is shown in FIG. 5.

Figure 6:
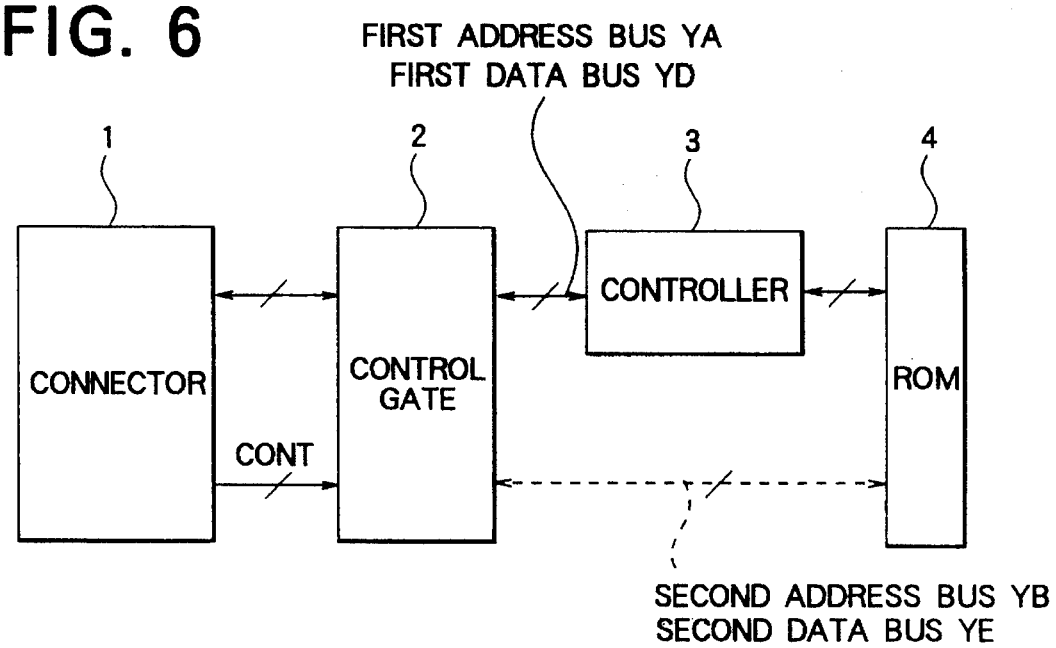
FIG. 6 explains the operation of an IC card according to the first embodiment of the invention.

This state is diagrammatically represented in FIG. 6. In this figure, the solid line represents the connected bus while the broken line represents the bus which is not in its connected state. Further, "CONT" in the figure signifies the control signals $\overline{S}$ and G. As can be seen from FIG. 6, the controller 3 operates in accordance with the program stored in the ROM 4 to transmit data input via the connector 1 and the control gate 2 to the outside and to output data received from the outside to the external equipment 11 via the connector 1 and the control gate 2.

Operation at the time of rewriting the content of the ROM 4 will be described below. If rewriting of (access to) the ROM 4 is necessary, the control signal G is brought to its "H" level. Thereby, as shown in FIGS. 3 and 5, the address bus A and data bus D are connected to the second address bus YB and second data bus YE, respectively. At this time, the first address bus YA and first data bus YD are in their high-impedance (Z) state. As a result, the ROM 4 is connected to the address bus (YB$_1$~YB$_4$) and data bus (YE$_1$~YE$_4$) of the control gate 2. It should be noted that the direction of inputting/outputting of data in the data bus is similarly controlled by the control signal G.

Figure 7:
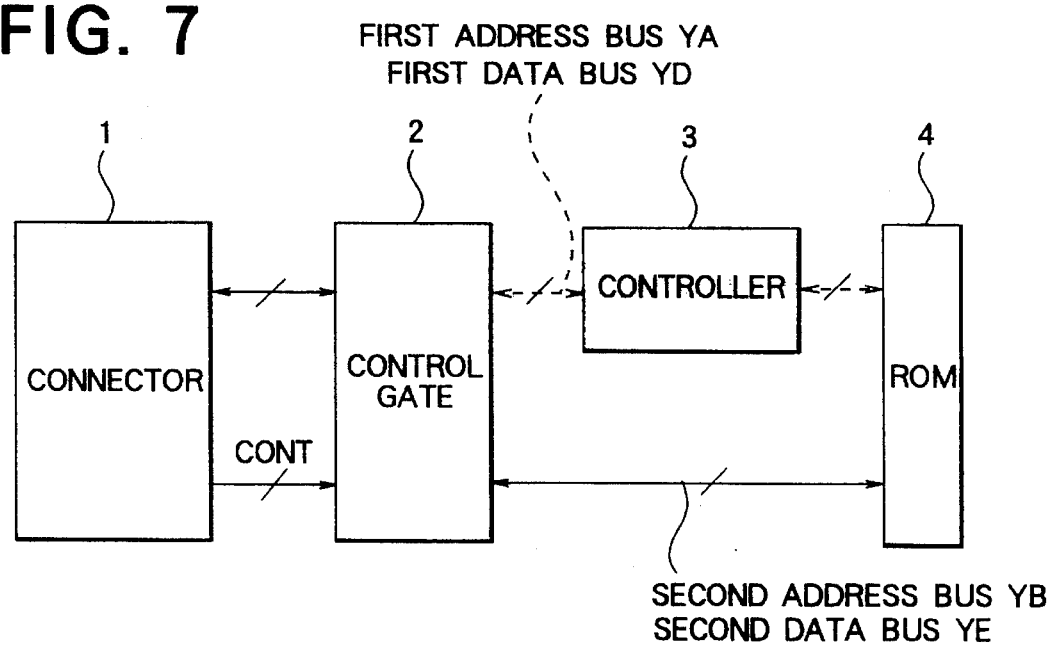
FIG. 7 explains the operation of an IC card according to the first embodiment of the invention.

This state is diagrammatically represented in FIG. 7. Similarly to the case of FIG. 6, the solid line represents the bus which is actually connected while the broken line represents the buses that are not connected (i.e., the first address bus YA and first data bus YD, and the address bus (ZA$_1$~ZA$_4$) and data bus (ZD$_1$~ZD$_4$) of the controller 3). As can be seen from FIG. 7, the controller 3 is disconnected from the ROM 4. In other words, the external equipment 11 can directly access the ROM 4 via the connector 1 and the control gate 2. Since data in the ROM 4 may be electrically deleted as an EEPROM or flash memory, the external equipment 11 is able to access the ROM 4 to directly rewrite its content.

As described above, according to the first embodiment, the external equipment is able to directly access the ROM incorporated into the IC card to modify the content of the ROM. It is therefore possible to readily modify the content of the ROM without dismantling the IC card to replace the ROM even when the IC card itself is not provided with the function of rewriting the content of the ROM.

Second Embodiment

In the first embodiment, switching of the control gate 2 is effected in accordance with the control signal input from the external equipment 11 via the connector 1. However, there are cases where a control signal cannot be added because the number of pins of the connector is limited. Further, in some cases, a control signal cannot be added because of the standard for the IC card. In such case, a register may be additionally provided so that the control gate is switched when data of a specific code ior switching is received.

Figure 8:
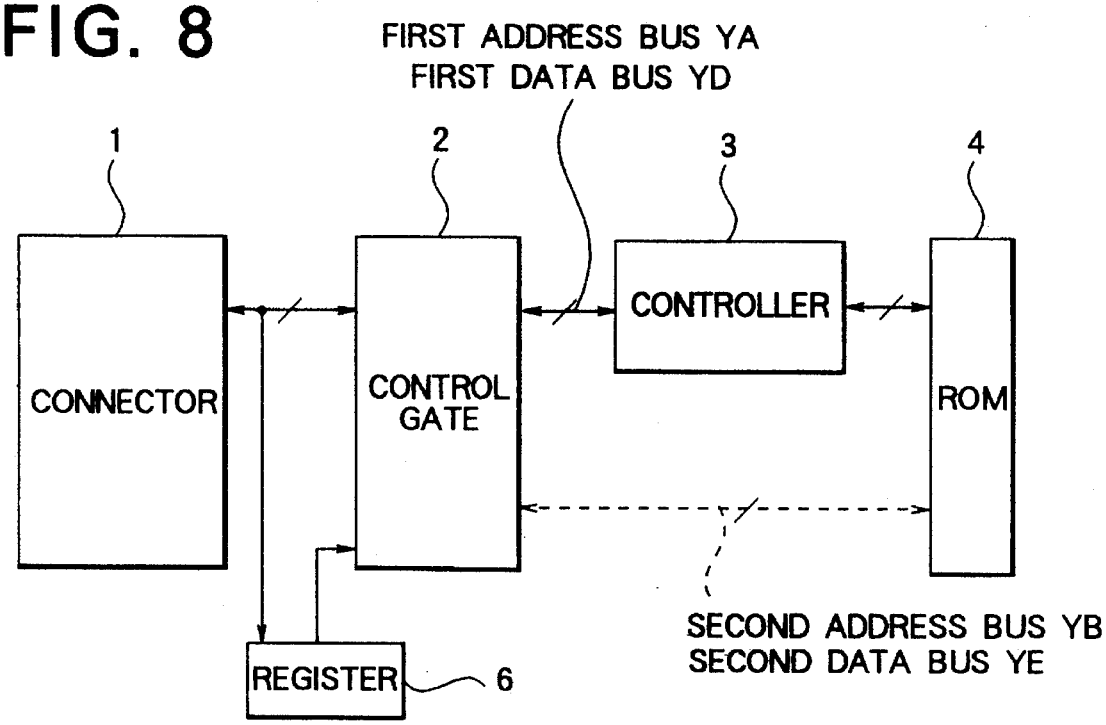
FIG. 8 is a block diagram of an IC card according to a second embodiment of the invention.

The construction of an IC card according to a second embodiment of the invention is shown in FIG. 8. In this figure, a register 6 receives and retains an address signal and data signal from the connector 1, and at the same time it detects the state of a stored code and provides a switching signal for the bus to the control gate 2. In other words, if the external equipment 11 is to rewrite the content of the ROM 4, the external equipment 11 outputs a predetermined address signal and data signal so as to cause the register 6 to retain predetermined data. The register 6 retains this data and checks if it coincides with the specific code. If a coincidence occurs, the register 6 outputs a switching signal to the control gate 2. Thereby, the second address bus YB and second data bus YE of FIG. 1 become effective so that the external equipment 11 is able to directly access the ROM 4.

As described above, according to the second embodiment, a register is provided so that the control gate is switched when data having a specific code for switching is received. It is thus possible to readily modify the content of the ROM by switching the control gate even when a control signal cannot be added.

Third Embodiment

It is also possible that a voltage detection circuit is provided instead of the register in the second embodiment, whereby the voltage level of the signal input from the outside is monitored to switch the control gate.

An IC card according to a third embodiment of the invention is shown in FIG. 9. In this figure, the voltage detection circuit 7 receives a predetermined signal (for example VPP signal) from the connector 1 and detects the level of such signal. It provides a switching signal for the bus to the control gate 2 when a previously determined level has been exceeded. The voltage detection circuit 7 comprises a resistor 71 and a Zener diode 72 which are connected in series with each other. One end of the resistor 71 is connected to one terminal (VPP signal) of the connector 1. On the other hand, the anode of the Zener diode 72 is grounded. Here, the output terminal of the voltage detection circuit 7 is formed at a point connecting the resistor 71 and the Zener diode 72.

When the external equipment 11 is to rewrite the content of the ROM 4, the external equipment 11 outputs a VPP signal exceeding a predetermined level so that the voltage detection circuit 7 provides a switching signal for bus to the control gate 2. To write data into the ROM 4, a VPP voltage of 12 V, in most cases, must be applied to the ROM 4. Its construction, therefore, must be such that the voltage detection circuit 7 switches the control gate 2 when a VPP voltage of 12 V is applied.

In the voltage detection circuit 7, the Zener diode 72 is brought to its electrically-conductive state when the level of the VPP signal is 12 V. Accordingly, the voltage detection circuit 7 at this time outputs an L level signal (ground signal). Thereby, the second address bus YB and second data bus YE of FIG. 1 become effective so that the external equipment is able to directly access the ROM 4.

In normal operation, on the other hand, the Zener diode 72 is not brought to its electrically-conductive state because the level of VPP signal is 5 V. The voltage detection circuit 7 at this time outputs an H level signal. Thus, the first address bus YA and first data bus YD of FIG. 1 become effective so that the controller 3 access the ROM 4.

According to the third embodiment, a voltage detection circuit is provided so that the control gate is switched when a signal of a predetermined level has been received. It is thus possible to readily modify the content of the ROM by switching the control gate even when a control signal cannot be added. Further, since a register is not used, there is no possibility that the register will be erroneously operated due to some unspecified cause and writing from external equipment is enabled. For this reason, the reliability of the card is improved.

It is also possible to combine the register of the second embodiment and the voltage detector of the third embodiment to switch the control gate 21 based on the logical OR of the two components. In this case, the control gate is switched to enable the external equipment to rewrite the ROM only when data of a specific code is retained at the register and at the same time a voltage exceeding a predetermined level is applied. Its reliability is very high because there is little possibility of an erroneous operation.

As described above, an IC card according to the present invention comprises: a memory for storing a program; an input-output section for inputting/outputting a signal from/to external equipment; a processing section for processing the input/output signal from/to the external equipment in accordance with the program in the memory; and a connection controlling section for, in normal operation, connecting the input-output section to the processing section and for connecting the input-output section to the processing section and the memory when the external equipment is to rewrite the content of the memory. The contents of the memory may thus be readily modified without dismantling the IC card to replace the memory even when the IC card itself is not provided with a function of rewriting the content of the memory.

A register for storing an input signal from the external equipment is provided so that the connection controlling section effects switching of connections when a predetermined signal is stored in the register. The content of the memory may be readily modified by switching the control gate even when an additional control signal cannot be provided for the input-output section of the IC card.

A detector for detecting the level of an input signal from the external equipment is provided so that the connection controlling section effects switching of connections when a level detected by the detector has exceeded a predetermined level. The content of the memory may be readily modified by switching the control gate even when an additional control signal cannot be provided for the input-output section of the IC card. Further, since no register is used, the register is not erroneously operated due to some unspecified cause and writing from the external equipment is enabled. The reliability of the card is thereby improved.

What is claimed is:

1. An IC card comprising:

a memory for storing a program;

an input-output section for inputting signals from and outputting signals to external equipment;

a processing section for processing the signals input from and output to the external equipment in accordance with the program stored in said memory; and a connection controlling section for, in normal operation, connecting said input-output section to said processing section and for connecting said input-output section to said processing section and to said memory when the external equipment is to rewrite said memory.

2. The IC card according to claim 1, including first and second address buses and first and second data buses wherein said connection controlling section, in normal operation, is connected to said processing section through said first address bus and said first data bus and, in rewriting said memory, is connected to said processing section and to said memory through said second address bus and said second data bus.

3. The IC card according to claim 2 wherein said connection controlling section includes a control gate comprising: a first inverter for inverting a selection signal received from the external equipment, input through said input-output section, and producing an output signal in response; a first address signal outputting buffer group for outputting an address signal to said first address bus based on the output signal from said first inverter; and a second address signal outputting buffer group for outputting an address signal to said second address bus based on a selection signal received from the external equipment and input through said input-output section.

4. The IC card according to claim 2, wherein said input-output section includes a third data bus and said connection controlling section includes a control gate comprising: a second inverter for inverting a selection signal received from the external equipment and input through said input-output section; a first gate circuit for controlling connection between said third data bus and said first data bus based on the selection signal and a gate signal of said input-output section; a second gate circuit for controlling connection between said third data bus and said second data bus based on an output of said second inverter and a gate signal received from the external equipment and input through said input-output section; a first data signal outputting buffer group for outputting a data signal to said first data bus based on an output signal of said first gate circuit; a second data signal outputting buffer group for outputting a data signal to said third data bus based on the output signal of said first gate circuit; a third data signal outputting buffer group for outputting a data signal to said second data bus based on an output signal of said second gate circuit; and a fourth data signal outputting buffer group for outputting a data signal to said third data bus based on the output signal of said second gate circuit.

5. The IC card according to claim 2 wherein said input-output section includes a third data bus and said connection controlling section includes a control gate comprising: a first inverter for inverting a selection signal received from the external equipment, input through said input-output section, and producing an output signal in response; a first address signal outputting buffer group for outputting an address signal to said first address bus based on the output signal from said first inverter; a second address signal outputting buffer group for outputting an address signal to said second address bus based on a selection signal received from the external equipment and input through said input-output section; a second inverter for inverting a selection signal received from the external equipment and input through said input-output section; a first gate circuit for controlling connection between said third data bus and said first data bus based on the selection signal and a gate signal of said input-output section; a second gate circuit for controlling connection between said third data bus and said second data bus based on an output of said second inverter and a gate signal received from the external equipment and input through said input-output section; a first data signal outputting buffer group for outputting a data signal to said first data bus based on an output signal of said first gate circuit; a second data signal outputting buffer group for outputting a data signal to said third data bus based on the output signal of said first gate circuit, a third data signal outputting buffer group for outputting a data signal to said second data bus based on an output signal of said second gate circuit; and a fourth data signal outputting buffer group for outputting a data signal to said third data bus based on the output signal of said second gate circuit.

6. The IC card according to claim 1 comprising a register for storing an input signal received from the external equipment and input through said input-output section, wherein said connection controlling section effects switching of connections when a predetermined signal is stored in said register.

7. The IC card according to claim 1 comprising a voltage detection circuit for detecting an input signal level received from the external equipment and input through said input-output section, wherein said connection controlling section effects switching of connections when the level detected by said voltage detection circuit exceeds a threshold level.

8. The IC card according to claim 7 wherein said voltage detection circuit comprises a resistor receiving an input signal from the external equipment and input through said input-output section, and a Zener diode connected in series with the resistor and grounded at its anode and wherein an output signal for effecting switching of connections is transmitted to said connection controlling section from a connection between said resistor and said Zener diode.

* * * * *